United States Patent [19]

Rifkin et al.

[11] 3,909,678

[45] Sept. 30, 1975

[54] PACKAGING STRUCTURE FOR A PLURALITY OF WAFER TYPE INTEGRATED CIRCUIT ELEMENTS

[75] Inventors: Alfred A. Rifkin, Wappinger Falls; Robert Wallace Staats, Lagrangeville, both of N.Y.

[73] Assignee: International Business Machines Corporation, Armonk, N.Y.

[22] Filed: Apr. 19, 1974

[21] Appl. No.: 462,461

[52] U.S. Cl. ....... 317/100; 174/15 R; 317/101 CM; 339/17 LM

[51] Int. Cl.[2] .......... H05K 7/20

[58] Field of Search ... 165/105; 339/17 CF, 17 LM, 339/17 M, 112 R, 194 R; 174/15 R, 16 R, DIG. 5; 317/100; 101 CM, 101 D, 120; 357/76, 79, 81, 82

[56] References Cited

UNITED STATES PATENTS

| | | | |
|---|---|---|---|
| 3,066,367 | 12/1962 | Garman | 339/17 M |
| 3,210,745 | 10/1965 | Dadamo | 317/101 D |
| 3,307,087 | 2/1967 | Rogers | 357/82 |
| 3,403,300 | 9/1968 | Horowitz | 317/101 CM |
| 3,418,533 | 12/1968 | Perotto | 317/101 CM |
| 3,798,510 | 3/1974 | Erickson | 357/76 |

*Primary Examiner*—Gerald P. Tolin
*Attorney, Agent, or Firm*—Charles S. Neave; Carl W. Laumann, Jr.

[57] ABSTRACT

An electronic assembly for large wafer circuit elements. The assembly includes a plurality of wafers, each mounted on a wafer support element by means of conductive spring-like members. The support elements are held in a plane parallel silo-like stacked relationship by means of conductive rods which provide a means for connection to the wafers. The "silo" is mounted within a liquid light housing containing a coolant material. The mounting accommodates temperature induced expansion and contraction of the silo.

2 Claims, 3 Drawing Figures

PACKAGING STRUCTURE FOR A PLURALITY OF WAFER TYPE INTEGRATED CIRCUIT ELEMENTS

BACKGROUND OF THE INVENTION

1. Field of the Invention

This invention relates to an electronic assembly made up of a plurality of wafer circuit elements and particularly to the physical configuration of the assembly.

2. Description of the Prior Art

As the technology relating to the fabrication of semiconductor circuits has improved it has become practical to fabricate larger and larger circuits on a single substrate without excessive expense due to poor yield. In the case of some circuits the yield has been improved to the point where it is practical to fabricate an entire wafer as a unitary device including thousands of circuits. This leads to problems in the packaging area due to heating effects, both destructive over-heating and temperature induced dimensional changes, and to the difficulty in making the requisite electrical connections to the wafer. While the prior art demonstrates the practicality of liquid cooling for smaller circuit elements no completely satisfactory system exists for large circuit elements such as might be fabricated from an entire wafer.

A satisfactory assembly of large wafer circuit elements should provide good immunity to shock and vibration induced during shipping and use. Since complete mechanical isolation of the wafer circuit element is not practical, some form of mechanical damping is desirable. These characteristics are not existant in prior art devices.

While immersion cooling is not new, it has generally been applied to planar configurations characterized by circuit cards, chip-on-board or molherboard arrangements. The difficulties in obtaining even temperatures over such large flat surfaces are well recognized and have not been solved without sacrifice or undue expense.

Alternative approaches to this same problem are described in a patent application, Ser. No. 462,463, by D. W. Skinner "A Wafer Circuit Package" and a patent application, Ser. No. 462,462, by W. B. Archey et al "A Liquid Ancapsulated Integrated Circuit Package" both assigned to the assignee of this application and filed on even date herewith.

SUMMARY OF THE INVENTION

The preferred embodiment of this invention is an assembly of a plurality of circuit elements which are an entire semiconductor wafer. The wafers are mounted on annular support elements by conductive, spring-like, support members. The support members are held in a spaced plane-parallel relationship by means of a plurality of conductive rods attached to the periphery of the support members to form a silo-like assembly. A liquid tight housing surrounds the silo to permit the circuit elements to be immersed in a liquid coolant material. The housing has heat conductive fins on the inside and outside to facilitate the extraction of heat from within the housing. The silo is fastened, at one end, to the housing. The other end of the silo is telescoped into a cylindrical sleeve to confine the silo against transverse movement while permitting temperature induced expansion and contraction in the axial direction. Electrical connections to the circuit elements are made through a liquid tight connecter in the housing, via flexible conductive elements to the conductive rods, then through conductive spring-like support members to the circuit element.

It is an object of this invention to provide an improved electronic assembly.

It is another object of this invention to provide an electronic assembly utilizing circuit elements which use an entire semiconductor wafer.

Still another object of the invention is to provide an electronic circuit assembly utilizing semiconductor wafer elements which are supported in silo-like fashion for resistance to mechanical shock and temperature induced dimensional changes as well as convenience in cooling.

The foregoing and other objects features and advantages of the invention will be apparent from the following more particular description of a preferred embodiment of the invention, as illustrated in the accompanying drawings.

DETAILED DESCRIPTION OF THE PREFERRED EMBODIMENT

Figure 1:
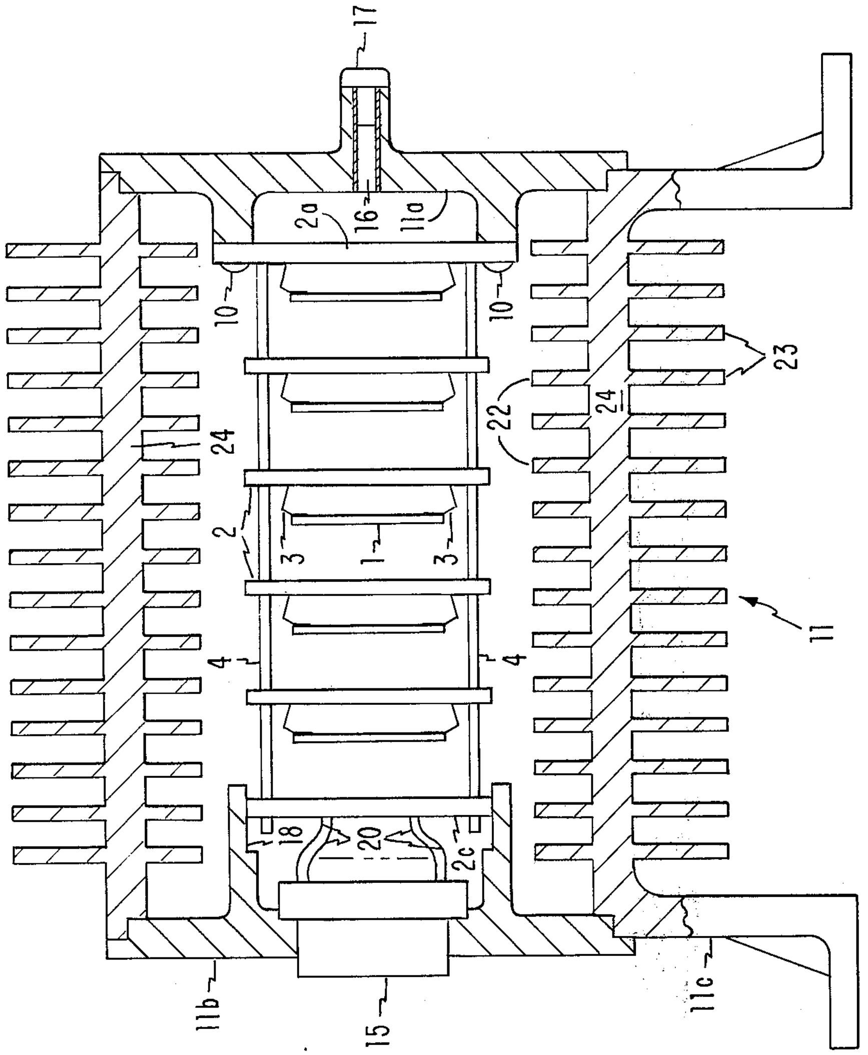
FIG. 1 is a partial view, taken in section, of the assembly.

FIG. 1 is a view, partially in section, of the preferred embodiment of this invention. The electronic assembly includes a plurality of semiconductor circuit elements 1. In the preferred form each circuit element 1 will be a single wafer sliced from a silicon crystal. A large number of integrated circuits are fabricated on the wafer in accordance with conventional practice. Although a wide variety of circuits may be so fabricated and used in this assembly, this embodiment contemplates the use of memory circuits since these are the easiest to create in a high density array and the number of required input-output connections is relatively low in relation to the numer of circuits on the wafer. Further, by incorporating certain addressing circuitry on the wafer itself, many wafers can be addressed in parallel, eliminating the need for individual connections to each wafer.

Each circuit element 1 is mounted on a wafer support element 2 by means of conductive spring-like support elements 3. The wafer support elements 2 may be fabricated from conventional materials such as an epoxy glass laminate. The support elements 3 are fabricated from a resilient material having good electrical conductivity such as a beryllium copper alloy. The material should also be adaptable to conventional bonding techniques such as thermo-compression welding, ultrasonic bonding or soldering.

Any one of these bonding techniques or a combination of these techniques may be used to fasten the conductive supports 3 to the wafer support element 2 and the circuit elements 1.

It is contemplated that small pad portions will be provided about the periphery of the wafer circuit element 1. The pad portions can be on the same side of the wafer as the active circuit elements or, by suitable inter-surface connections such as diffused high conductivity regions, the pad portion may be located on the opposite side of the wafer from the active circuit regions. The latter arrangement, while slightly more complex offers the advantage of more wafer surface area for active circuits. It is also within the contemplation of this invention that active circuits can be accommodated on both sides of wafer circuit element 1.

Figure 2:
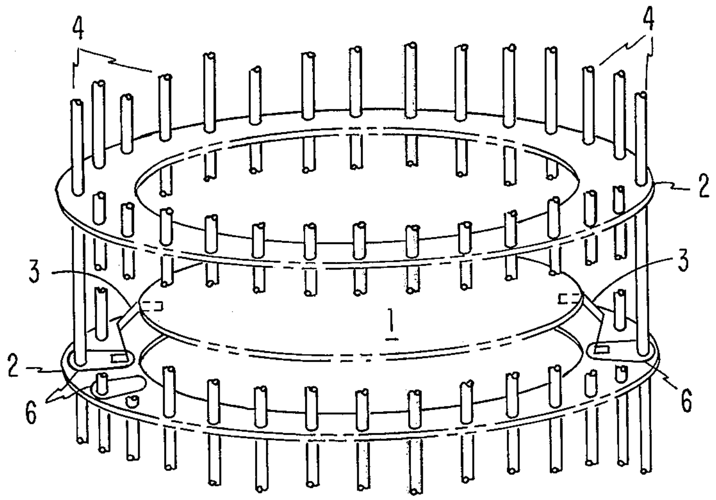
FIG. 2 is a partial view of a portion of the assembly including several wafer support element and a wafer.

A plurality of complementary conductive connection pads also exist on support elements 2. These pads are formed on the laminate by suitable etching or metallic deposition techniques. Each pad has a region adapted to be bonded to flat portions of the supports 3 and provide an electrical connection to the conductive rod members 4. The details of this arrangement are shown in FIG. 2. Because of the complexity of the drawing only three conductive connection pads 6 are shown. In practice each rod 4 would pass through a hole or slot in support member 2 and be electrically connected to a pad 6. The resulting array or rods, wafers and support elements forms a silo-like assembly.

As shown in FIG. 2 the spring-like support elements 3 can be a relatively flat conductor to provide optimum support or, in the alternative, a round configuration can be used. While the preferred form would utilize ultrasonic bonding or thermo-compression welding to fasten the support elements 2 to the conductive pads 6, it is also possible to provide additional holes or slots in the pad 6 to facilitate alignment and achieve the necessary mechanical and electrical connection by means of soldering.

The preferred form of the invention uses a support element 2 of annular form as shown in FIG. 2. This configuration provides optimum flow of a liquid coolant material without detracting from the adequacy of the mechanical support for the wafer circuit element 1.

Figure 3:
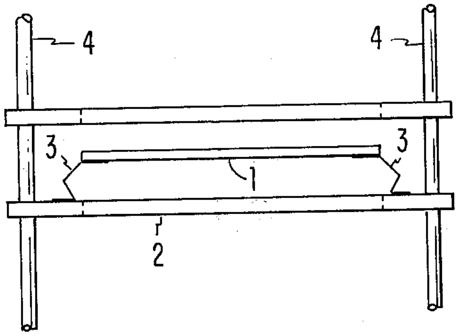
FIG. 3 is a sectional view of the portion shown in FIG. 2.

FIG. 3 illustrates the optimum configuration for the spring support elements 3. This configuration provides a shock mount to isolate the wafer element 1 from vibration.

Returning to FIG. 1, the lowermost wafer support element **2*a* is slightly greater in diameter than corresponding elements 2 to accommodate mounting screws 10 which affix support element 2*a* to the bottom plate 11*a* of housing 11.**

Housing 11 has a bottom plate **11*a*, a top plate 11*b* and a base member 11*c*. Top plate 11*b* has an aperture which accommodates an electrical connection means such as connector 15. The connector is liquid tight to prevent the escape of the liquid coolant which exists within housing 11. Bottom plate 11*a* and top plate 11*b* are secured to base member by suitable means such as screws which are not shown. Bottom plate 11*a* has a port 16 and removable plug 17 to permit the introduction of a coolant material into housing 11. The top plate 11*b* has a cylindrical sleeve 18 having an inner diameter which accommodates the uppermost support element 2*c*.**

As shown in FIG. 1 the uppermost support element **2*c* does not contain a semiconductor wafer circuit element. Instead, support element 2*c* contains conductive pads, not shown, which serve to connect rods 4 to the flexible leads 20 going to electrical connector 15. In the alternative, leads 20 could be affixed directly to rod members 4 thereby allowing a circuit element to be mounted on the support element 2*c*.**

The outer diameter of support element **2*c* is slightly less than the inner diameter of cylindrical sleeve 18 to provide a telescoping fit. This allows the support element 2*c* to move up and down within sleeve 18 to accommodate the effect of temperature induced dimensional changes in rods 4.** Thus, the assembly is restrained against transverse movement.

Base member **11*c* of housing 11 has a plurality of fins 22 on the inside of the housing and a plurality of fins 23 around the outside of the housing. The inner fins 22 absorb heat from the liquid coolant within the housing. The heat thus absorbed is conducted through the wall 24 to outer fins 23 where it is dissipated in air. The liquid coolant can be any satisfactory material such as those in the class of fluorinated hydrocarbons well known in the art and frequently used to cool electronic components. In addition to its function as a coolant, the liquid provides a damping action on motion of wafer elements 1.**

While the invention has been particularly shown and described with reference to a preferred embodiment thereof, it will be understood by those skilled in the art that the foregoing and other changes in form and details may be made therein without departing from the spirt and scope of the invention.

What is claimed:

1. An electronic wafer type assembly comprising:

a plurality of wafer type circuit elements having pad portions adapted for electrical connection purposes, a corresponding plurality of annular wafer support elements disposed parallel and adjacent to said circuit elements, a plurality of electrical connection pads on each of said wafer support elements, a plurality of conductive, spring-like, support members affixed at one end to said pad portions on said circuit elements and at the other end to said pad portions on said wafer support elements to provide an electrical connection therebetween, mounting means comprising a plurality of conductive rod members for said wafer support elements holding said support elements in spaced parallel relationship to provide a silo-like assembly and each of said rod members engaging pads on said wafer support elements to establish electrical connections to said support elements, and a housing surrounding said support members and circuit elements and adapted to retain said circuit elements in a liquid coolant material.

2. An assembly according to claim 1 further including;

means for rigidly fastening one end of said silo-like assembly to said housing, a cylindrical sleeve assembly extending inwardly from said housing in axial alignment with said silo-like assembly providing a telescoping confinement of the other end of said silo-like assembly by said sleeve, liquid tight connection means in the wall of said housing in proximity to said sleeve assembly, a plurality of flexible conductive elements connected at one end to said silo-like assembly and at the other end to said connection means, and means connecting said flexible conductive elements to said conductive rods.

* * * * *